(12) United States Patent
Michikoshi

(10) Patent No.: US 11,710,682 B2
(45) Date of Patent: *Jul. 25, 2023

(54) SEMICONDUCTOR DEVICE

(71) Applicant: SUMITOMO ELECTRIC INDUSTRIES, LTD., Osaka (JP)

(72) Inventor: Hisato Michikoshi, Ibaraki (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 240 days.

This patent is subject to a terminal disclaimer.

(21) Appl. No.: 17/348,973

(22) Filed: Jun. 16, 2021

(65) Prior Publication Data
US 2021/0313257 A1 Oct. 7, 2021

Related U.S. Application Data

(63) Continuation of application No. 16/618,885, filed as application No. PCT/JP2018/004083 on Feb. 6, 2018, now Pat. No. 11,069,603.

(30) Foreign Application Priority Data

Jun. 20, 2017 (JP) ................................. 2017-120262

(51) Int. Cl.
H01L 23/495 (2006.01)
H01L 23/31 (2006.01)
(Continued)

(52) U.S. Cl.
CPC .... *H01L 23/49562* (2013.01); *H01L 23/3107* (2013.01); *H01L 24/06* (2013.01); *H01L 24/48* (2013.01); *H01L 25/07* (2013.01); *H01L 25/18* (2013.01); *H01L 2224/0603* (2013.01); *H01L 2224/48091* (2013.01);
(Continued)

(58) Field of Classification Search
CPC ........... H01L 23/49562; H01L 23/3107; H01L 23/49548; H01L 24/06; H01L 24/48; H01L 24/45; H01L 25/07; H01L 25/18
See application file for complete search history.

(56) References Cited

U.S. PATENT DOCUMENTS 5,977,630 A 11/1999 Woodworth et al.
6,143,981 A 11/2000 Glenn
(Continued)

FOREIGN PATENT DOCUMENTS

JP 2003-110077 4/2003
JP 2004-039709 2/2004
(Continued)

Primary Examiner — Marc Anthony Armand
(74) Attorney, Agent, or Firm — IPUSA, PLLC

(57) ABSTRACT

A semiconductor device includes: a first electrode terminal; a second electrode terminal; a semiconductor element having an electrode on one surface connected to one surface of the first electrode terminal; a wire that connects an electrode on the other surface of the semiconductor element and the second electrode terminal; and a resin portion formed of an insulator covering the semiconductor element, a part of the second electrode terminal, and the one surface of the first electrode terminal, wherein a chamfered portion is formed on at least one of end portions where the first electrode terminal and the second electrode terminal face each other.

26 Claims, 12 Drawing Sheets

(51) Int. Cl.
*H01L 23/00* (2006.01)
*H01L 25/07* (2006.01)
*H01L 25/18* (2023.01)

(52) U.S. Cl.
CPC ............. *H01L 2224/48247* (2013.01); *H01L 2924/13* (2013.01); *H01L 2924/181* (2013.01)

(56) References Cited

U.S. PATENT DOCUMENTS

| | | |
|---|---|---|
| 6,756,658 B1 | 6/2004 | Gillett et al. |
| 7,199,461 B2 | 4/2007 | Son et al. |
| 9,397,029 B1 | 7/2016 | Xue et al. |
| 2001/0054752 A1 | 12/2001 | Woodworth et al. |
| 2003/0062608 A1 | 4/2003 | Hamachi |
| 2013/0017652 A1* | 1/2013 | Tsui ................ H01L 24/49 438/118 |
| 2014/0353710 A1* | 12/2014 | Zitzlsperger ............ H01L 33/52 438/23 |
| 2015/0055310 A1 | 2/2015 | Viswanathan et al. |
| 2018/0183429 A1* | 6/2018 | Chen ................ H01L 23/49562 |

FOREIGN PATENT DOCUMENTS

| | | |
|---|---|---|
| JP | 2009-267054 | 11/2009 |
| JP | 2014-170801 | 9/2014 |

* cited by examiner

SEMICONDUCTOR DEVICE

The present application is a continuation application and claims priority under 35 U.S.C 120 to U.S. patent application Ser. No. 16/618,885 filed on Dec. 3, 2019, which is the National Stage of International Application No. PCT/JP2018/004083 filed on Feb. 6, 2018, which is based on and claims priority to Japanese Patent Application No. 2017-120262, filed on Jun. 20, 2017. The contents of the applications are incorporated herein by reference in their entirety.

TECHNICAL FIELD

The present disclosure relates to a semiconductor device.

BACKGROUND ART

A semiconductor device, such as a metal-oxide-semiconductor field-effect transistor (MOSFET), is usually fixed by a mold resin or the like in a state in which a semiconductor chip and electrode terminals are connected. For such a semiconductor device, various devices for enhancing the withstanding voltage are made.

PRIOR ART DOCUMENT

Patent Document

[Patent Document 1] U.S. Pat. No. 7,199,461

SUMMARY OF THE INVENTION

According to one aspect of the present embodiment, a semiconductor device includes: a first electrode terminal; a second electrode terminal; a semiconductor element having an electrode on one surface connected to one surface of the first electrode terminal; and a wire that connects an electrode on the other surface of the semiconductor element and the second electrode terminal. Further, the semiconductor device includes a resin portion formed of an insulator covering the semiconductor element, a part of the second electrode terminal, and the one surface of the first electrode terminal, wherein a chamfered portion is formed on at least one of end portions where the first electrode terminal and the second electrode terminal face each other.

Figure 1A:
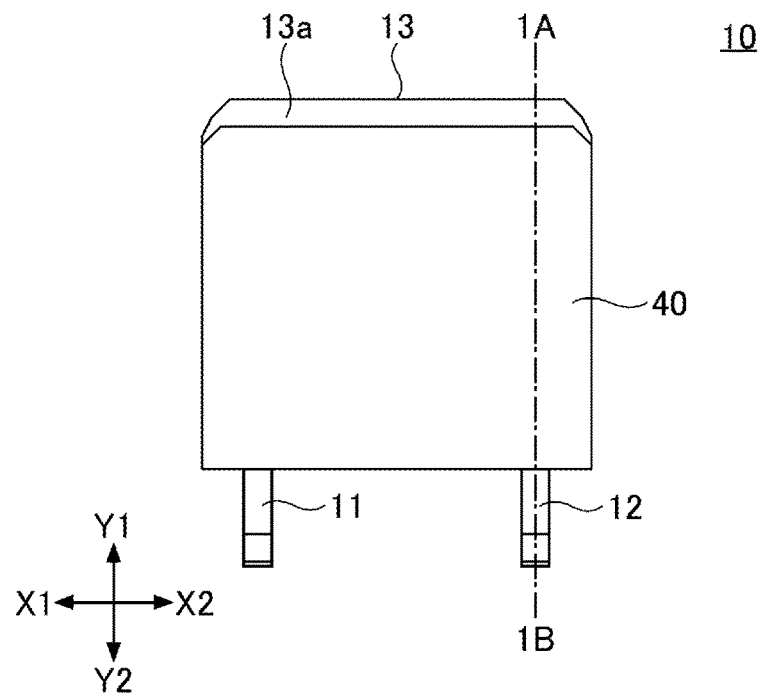
Figure 1B:
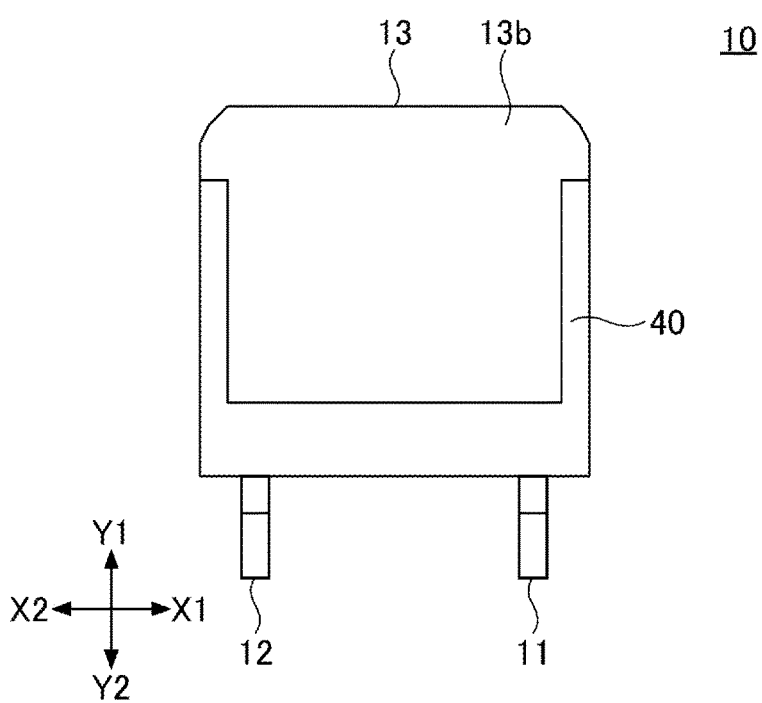
Figure 1C:
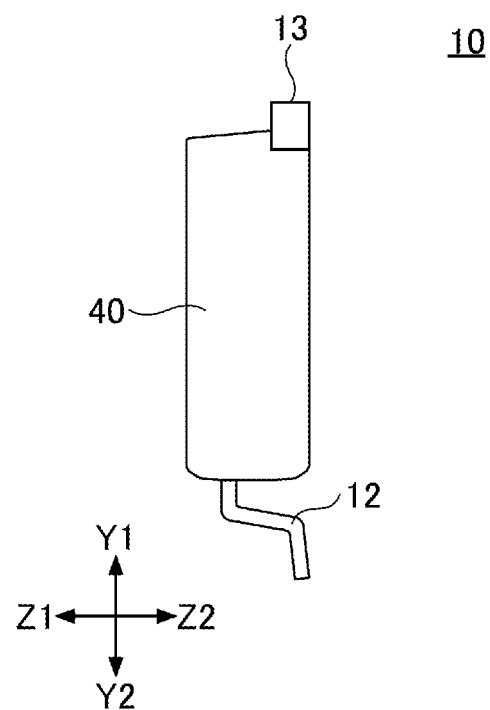
Figure 2:
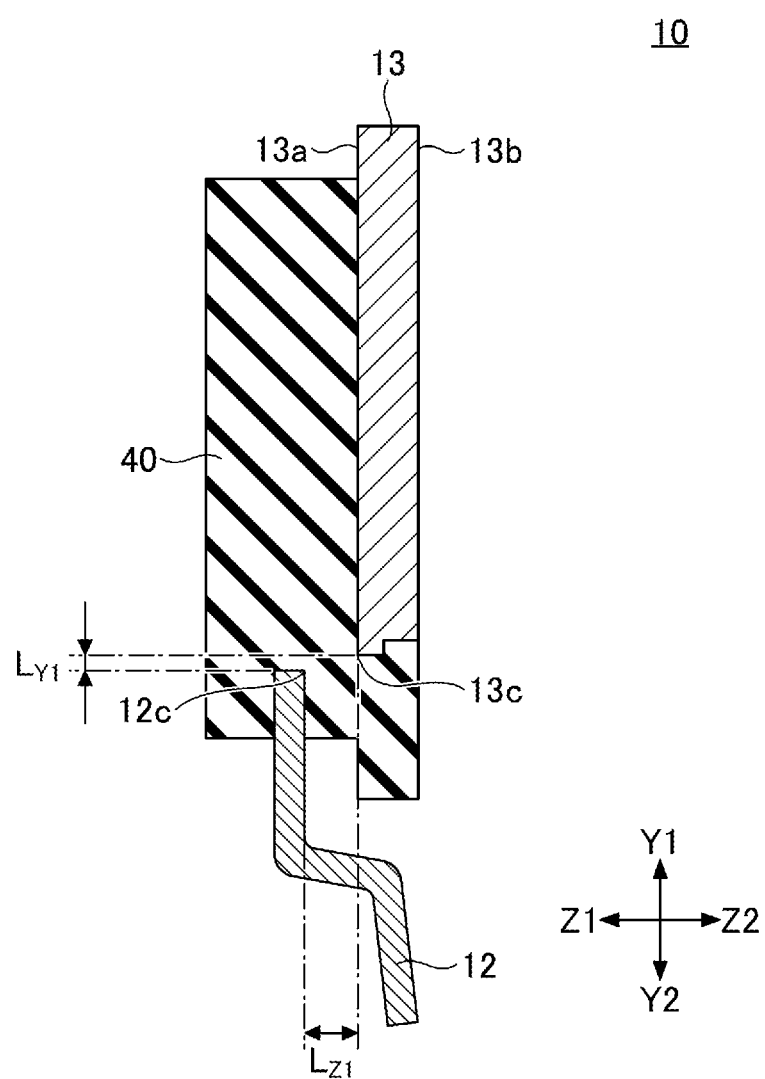
Figure 3:
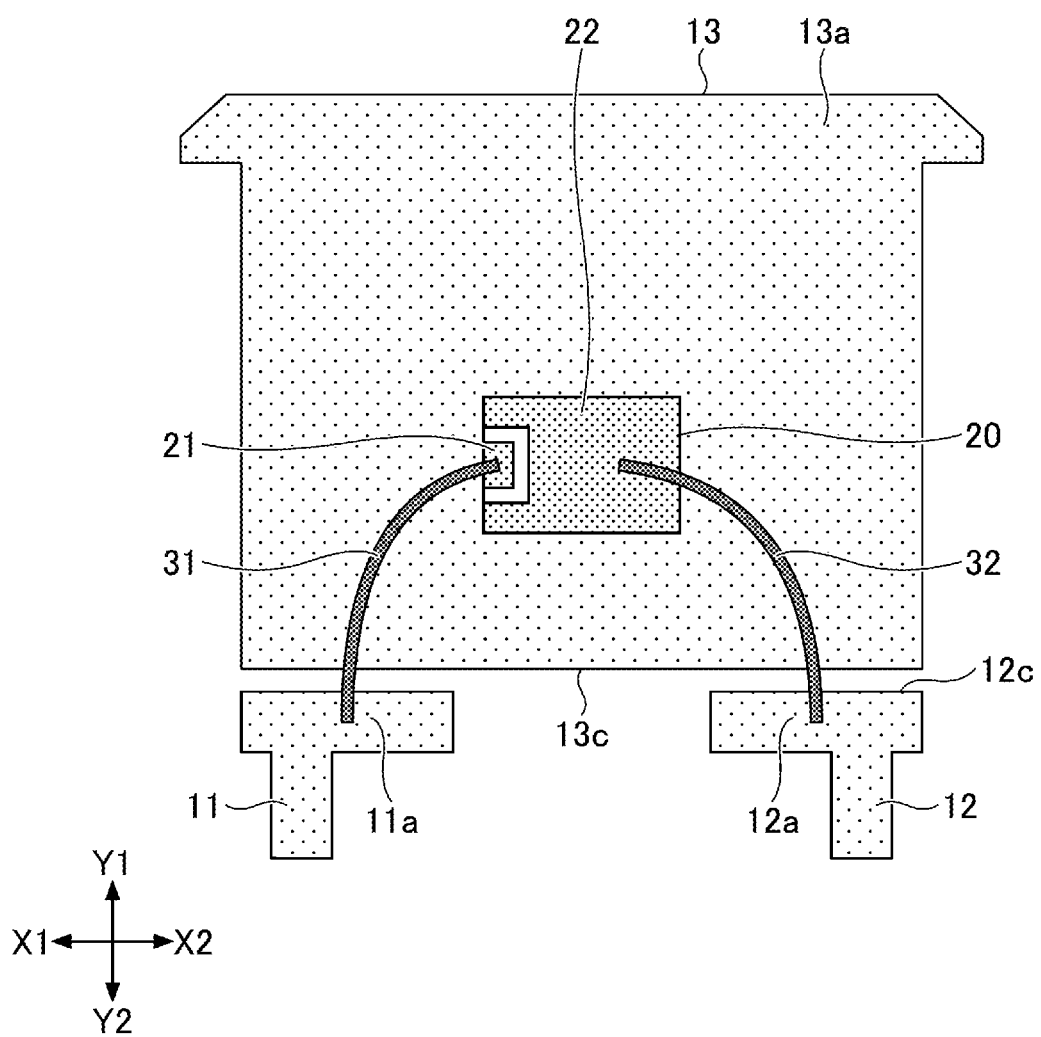
Figure 4A:
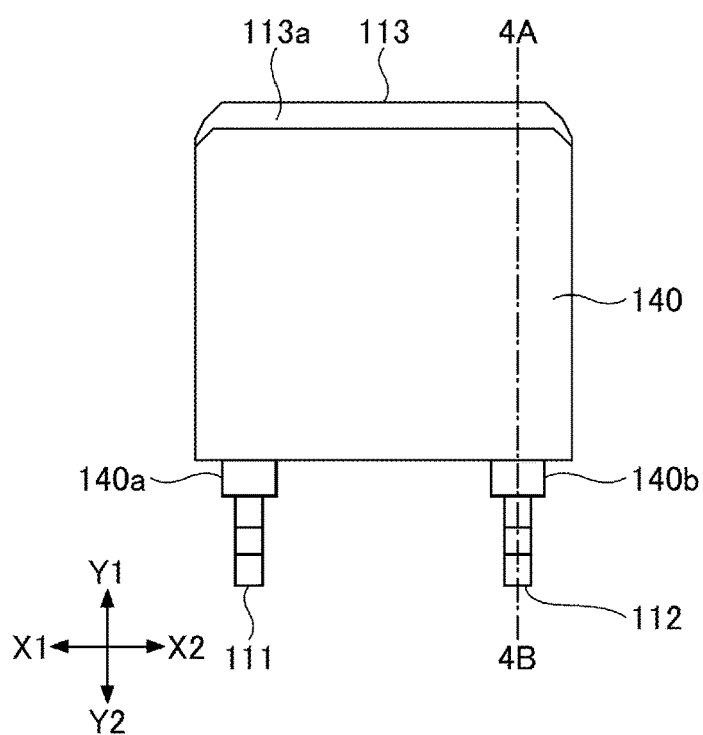
Figure 4B:
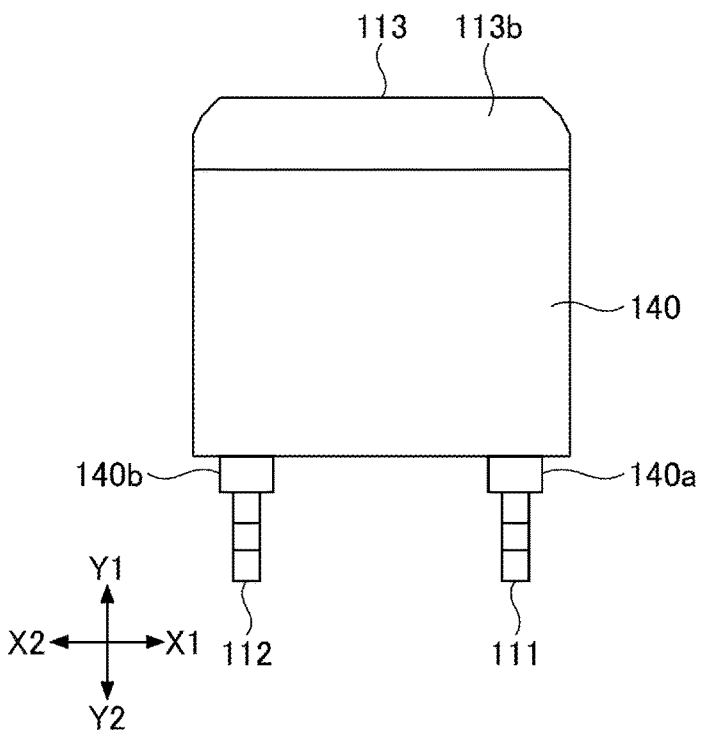
Figure 4C:
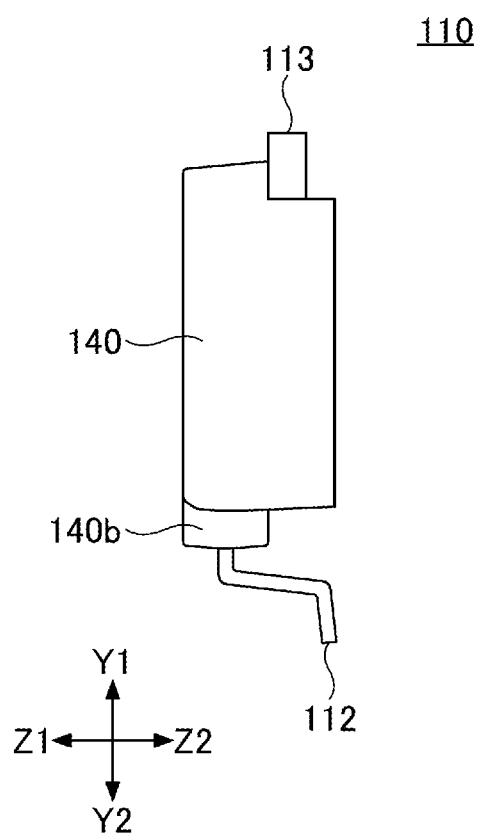
Figure 5:
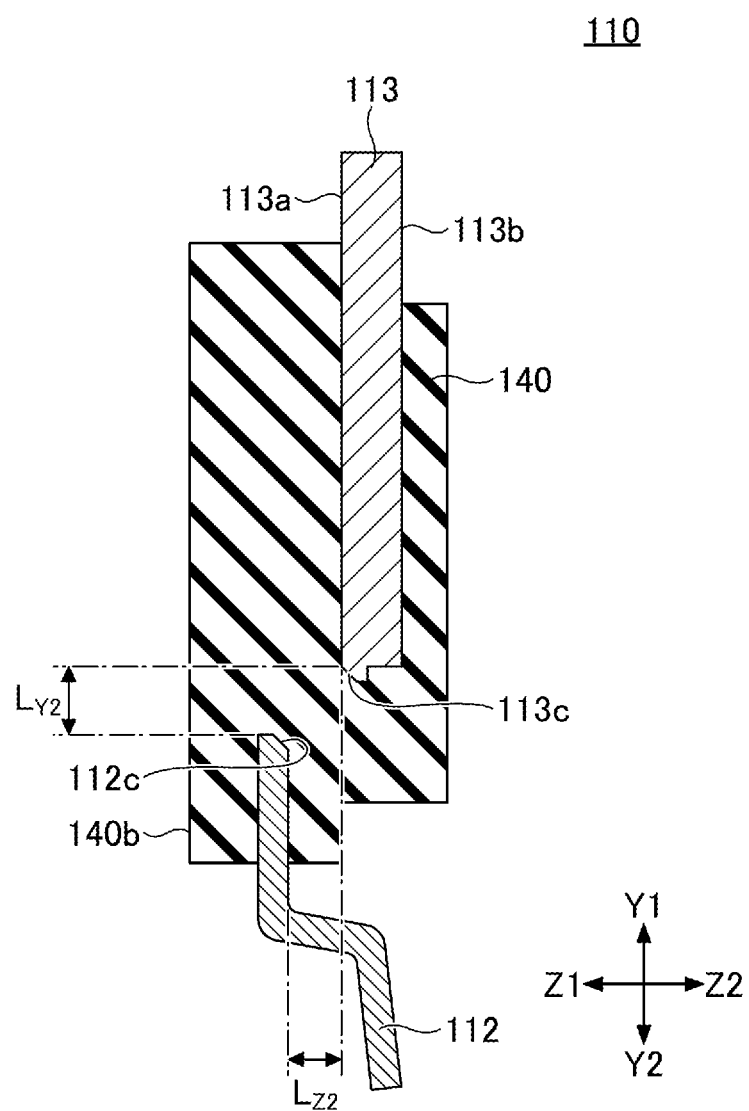
Figure 6:
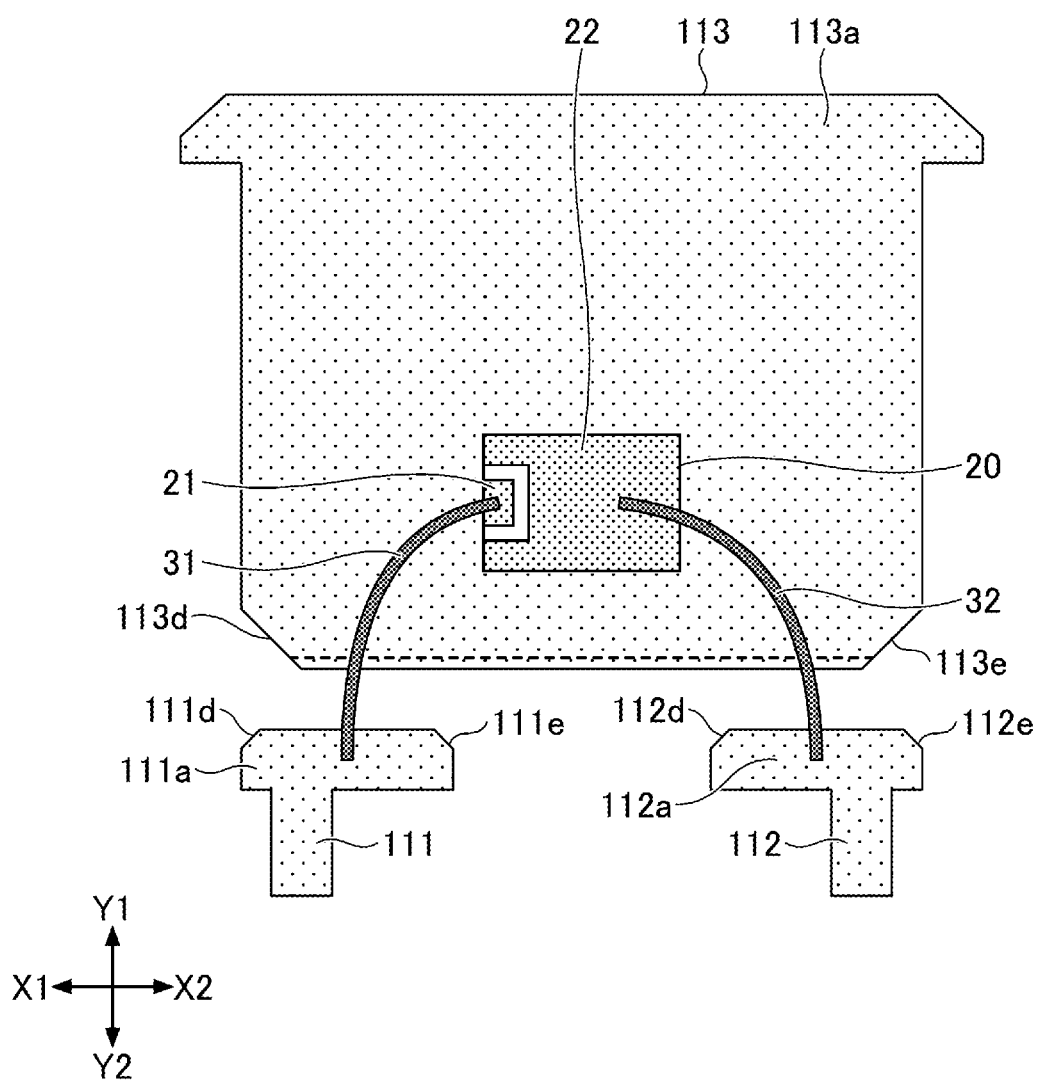
Figure 7:
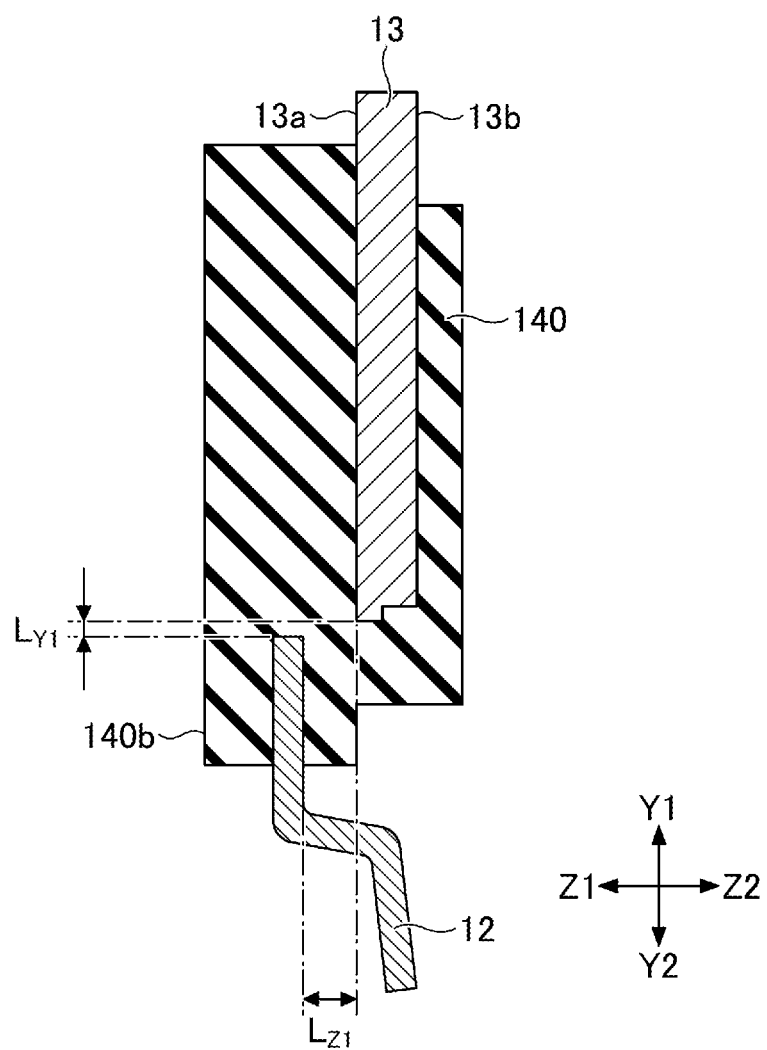
Figure 8:
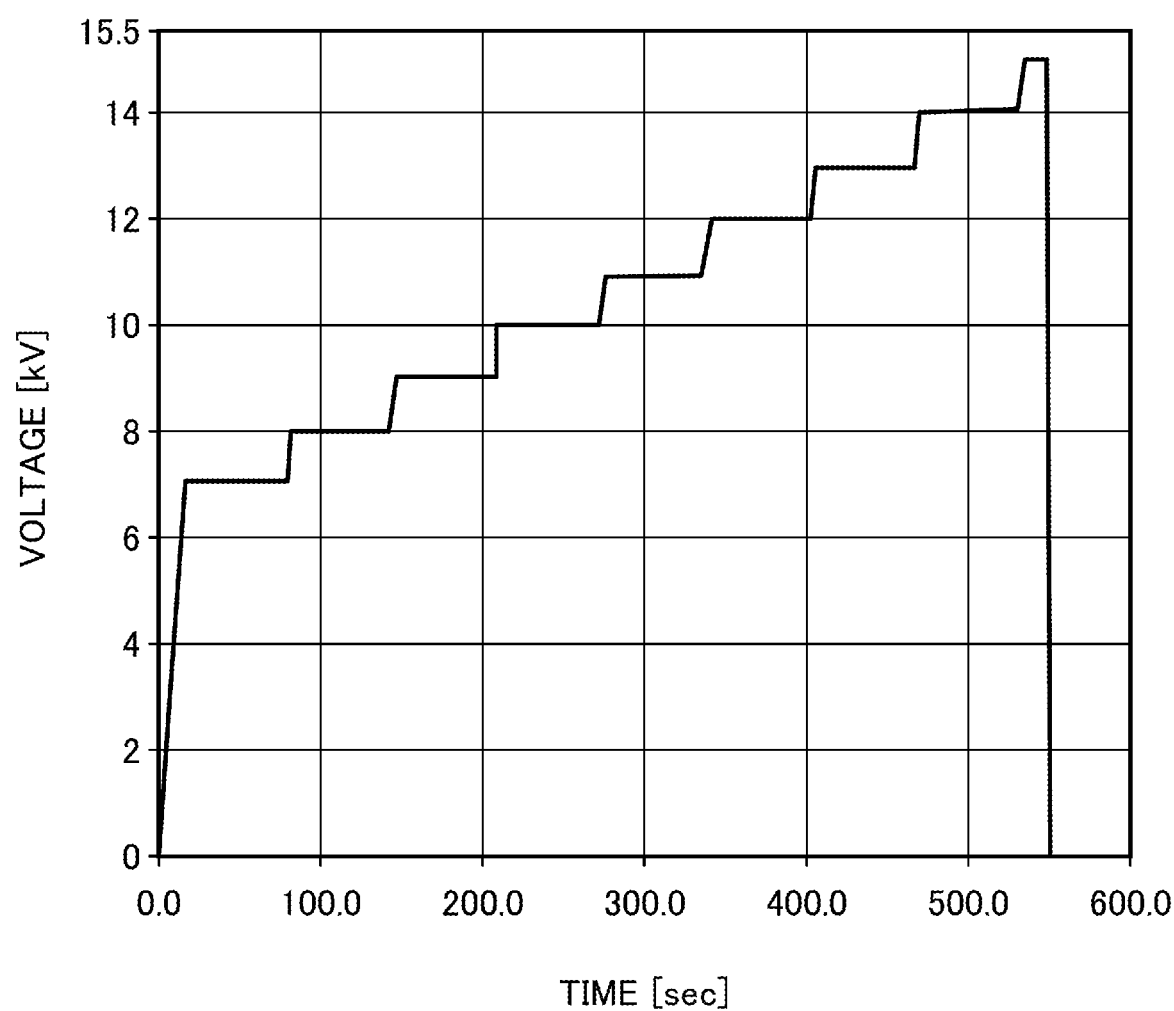
Figure 9:
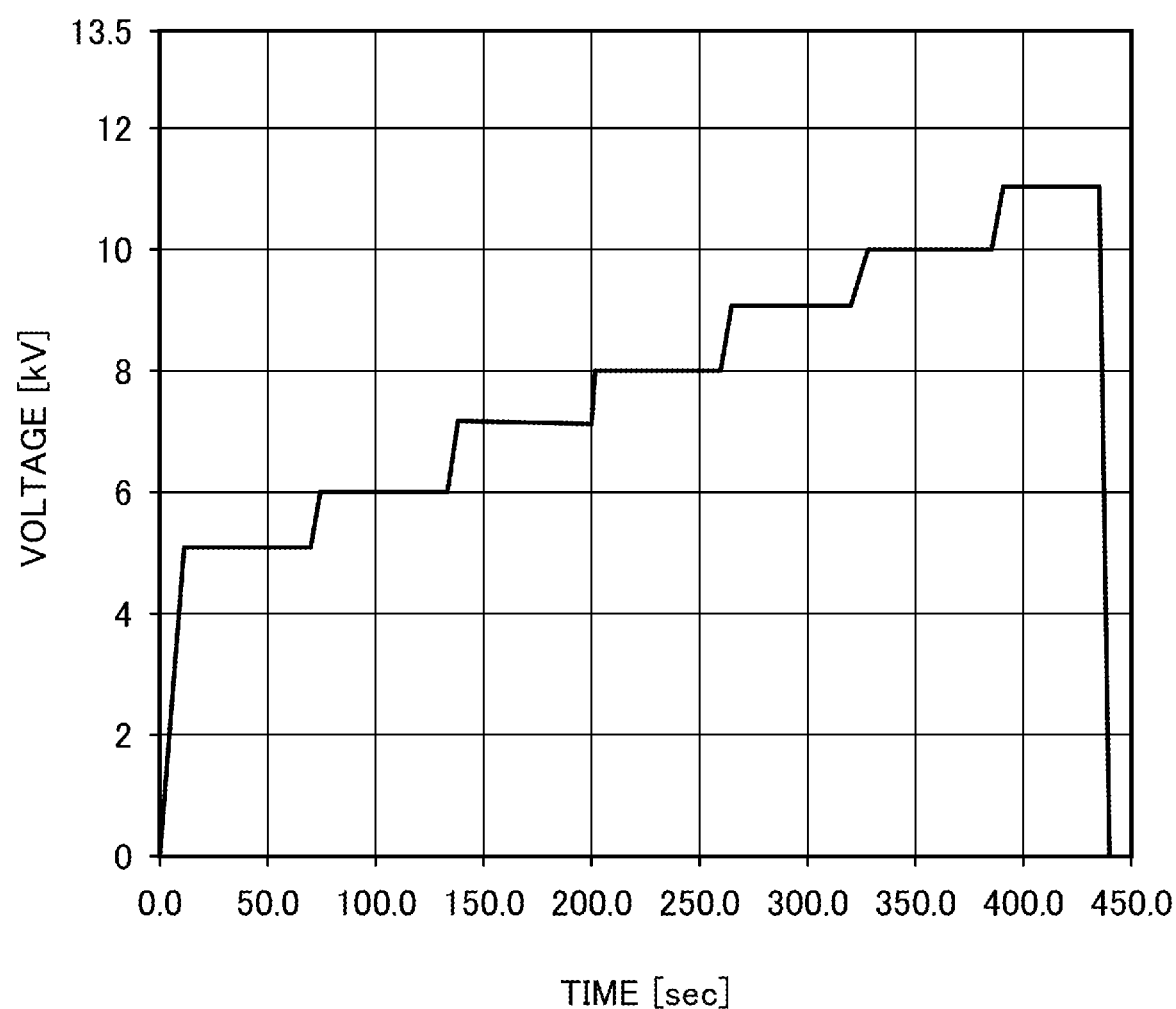
Figure 10:
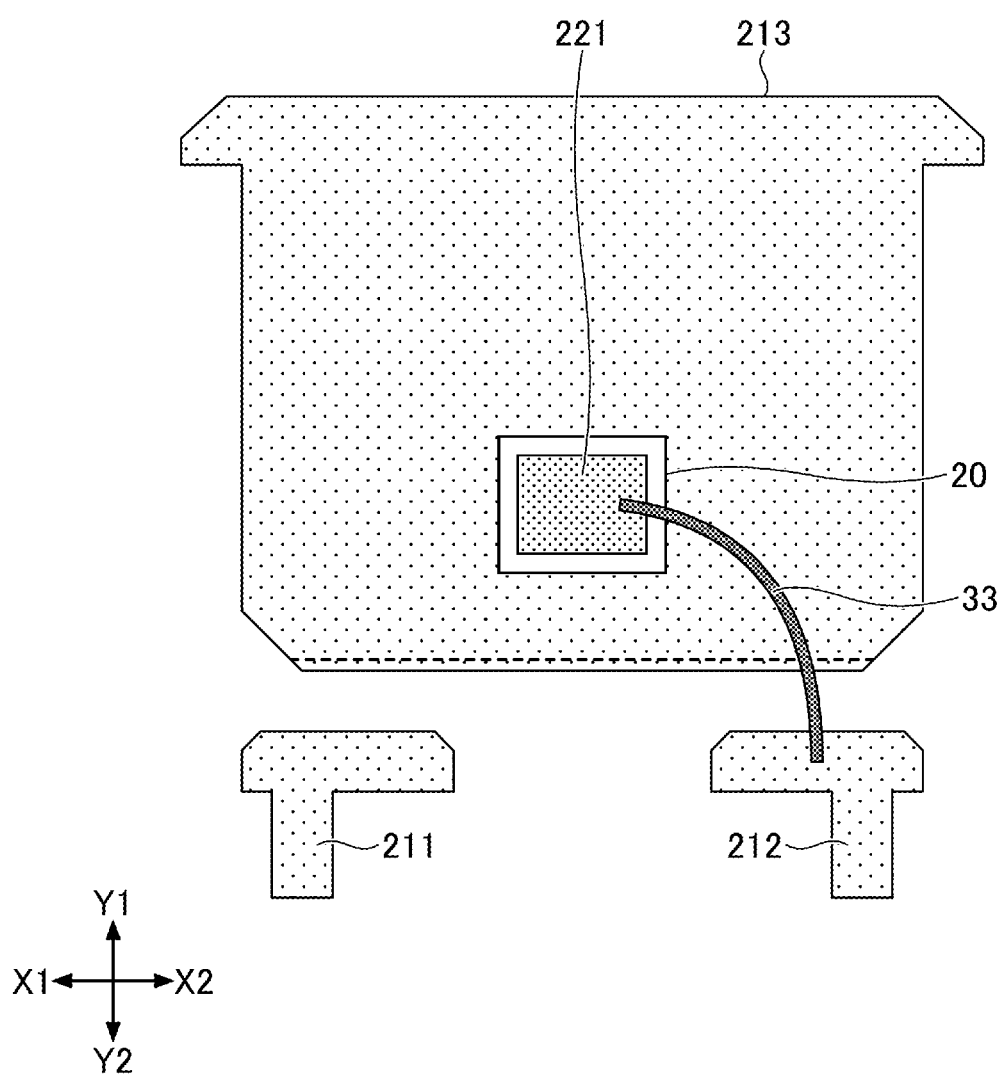

FIG. 1A is a top view of a semiconductor device;
FIG. 1B is a bottom view of the semiconductor device;
FIG. 1C is a side view of the semiconductor device;
FIG. 2 is a cross-sectional view of the semiconductor device;
FIG. 3 is an explanatory diagram of the semiconductor device;
FIG. 4A is a top view of a semiconductor device according to one aspect of the present disclosure;
FIG. 4B is a bottom view of the semiconductor device according to one aspect of the present disclosure;
FIG. 4C is a side view of the semiconductor device according to one aspect of the present disclosure;
FIG. 5 is a cross-sectional view of the semiconductor device according to one aspect of the present disclosure;
FIG. 6 is an explanatory diagram of the semiconductor device according to one aspect of the present disclosure;
FIG. 7 is an explanatory diagram of a semiconductor device used in comparison;
FIG. 8 is a diagram illustrating a result of a breakdown voltage test of the semiconductor device illustrated in FIGS. 1A to 1C;
FIG. 9 is a diagram illustrating a result of a breakdown voltage test of the semiconductor device according to one aspect of the present disclosure; and
FIG. 10 is a structural diagram of a semiconductor device according to another aspect of the present disclosure.

EMBODIMENT FOR CARRYING OUT THE INVENTION

Although silicon is a typical semiconductor material that is used in a semiconductor device, in order to enhance the withstanding voltage, SiC or the like having a band gap wider than that of Si may be used. In such a semiconductor device, a high withstanding voltage is required from a structural point of view. Accordingly, the present disclosure has an object to provide a semiconductor device having a high withstanding voltage.

In the following, an embodiment to be carried out will be described.

DESCRIPTION OF EMBODIMENT OF THE PRESENT DISCLOSURE

To begin with, aspects of the present disclosure are listed and described below. In the following description, the same reference characters are allotted to the same or corresponding elements and the same descriptions thereof are not repeated.

[1] A semiconductor device according to one aspect of the present disclosure includes: a first electrode terminal; a second electrode terminal; a semiconductor element having an electrode on one surface connected to one surface of the first electrode terminal; a wire that connects an electrode on the other surface of the semiconductor element and the second electrode terminal; and a resin portion formed of an insulator covering the semiconductor element, a part of the second electrode terminal, and the one surface of the first electrode terminal, wherein a chamfered portion is formed on at least one of end portions where the first electrode terminal and the second electrode terminal face each other.

The inventor of the present application has studied that in a case where a high voltage is applied between a first electrode terminal and a second electrode terminal, dielectric breakdown or discharging tends to occur at a portion where the first electrode terminal and the second electrode terminal covered by a resin portion face each other. As a result, it has been conceived and confirmed by experiments, simulations, and the like that such dielectric breakdown or discharging tends to occur because the portion where the first electrode terminal and the second electrode terminal face each other is substantially right angle or sharply angled, and that there is a possibility that the withstanding voltage may be enhanced by chamfering this portion into a C-surface or a R-surface. The semiconductor device according to one aspect of the present disclosure is based on the result obtained as described, and the withstanding voltage of the semiconductor device can be enhanced with a relatively easy means.

[2] A chamfered portion is formed on both of the end portions where the first electrode terminal and the second electrode terminal face each other.

[3] The chamfered portion is a C-surface.
[4] The chamfered portion is a R-surface.
[5] The chamfered portion is a flat surface.
[6] The chamfered portion is a rounded surface.
[7] The semiconductor device includes a third electrode terminal, wherein the semiconductor element is a unipolar transistor, the first electrode terminal is a drain electrode terminal, the second electrode terminal is a source electrode terminal, and the third electrode terminal is a gate electrode terminal, and the third electrode terminal is connected by another wire to another electrode on the other surface of the semiconductor element.

[8] The semiconductor device includes a third electrode terminal, wherein the semiconductor element is a bipolar transistor, the first electrode terminal is a collector electrode terminal, the second electrode terminal is an emitter electrode terminal, and the third electrode terminal is a base electrode terminal, and the third electrode terminal is connected by another wire to another electrode on the other surface of the semiconductor element.

[9] The semiconductor device includes a third electrode terminal, wherein the semiconductor element is an IGBT, the first electrode terminal is a collector electrode terminal, the second electrode terminal is an emitter electrode terminal, and the third electrode terminal is a gate electrode terminal, and the third electrode terminal is connected by another wire to another electrode on the other surface of the semiconductor element.

[10] The semiconductor element is a diode, and the first electrode terminal is a cathode electrode terminal and the second electrode terminal is an anode electrode terminal.

[11] The semiconductor element is formed of SiC.

[12] A portion of the other surface of the first electrode terminal is also covered by the resin portion.

DETAILS OF EMBODIMENT OF THE PRESENT DISCLOSURE

In the following, an embodiment of the present disclosure (which is hereinafter referred to as the "present embodiment") will be described in detail, but the present embodiment is not limited to the following.

A semiconductor device according to the present embodiment will be described in comparison with a semiconductor device different from the present embodiment.

FIG. 1 to FIG. 3 are a semiconductor device that is fixed by a mold resin or the like in a state in which a semiconductor chip and electrode terminals are connected, which is the semiconductor device having a structure in which the semiconductor chip is formed by a MOSFET. Note that FIG. 1A is a top view of the semiconductor device that is fixed by the mold resin or the like in a state in which the semiconductor chip and the electrode terminals are connected, FIG. 1B is a bottom view, and FIG. 1C is a side view. FIG. 2 is a cross-sectional view taken along dotted line 1A-1B in FIG. 1A, and FIG. 3 is a top view of this semiconductor device in which the mold resin is removed. Note that in FIG. 2 and FIG. 3, the size of the semiconductor device is enlarged for convenience.

The semiconductor device 10 includes a gate electrode terminal 11, a source electrode terminal 12, and a plate-shaped drain electrode terminal 13 that is a die pad. With respect to a semiconductor chip 20, a drain electrode pad side of the semiconductor chip 20 is mounted on the drain electrode terminal 13 and is joined by solder or the like. Also, a gate electrode pad 21 of the semiconductor chip 20 is connected to the gate electrode terminal 11 by a bonding wire 31 or the like, and a source electrode pad 22 is connected to the source electrode terminal 12 by a bonding wire 32 or the like.

In this semiconductor device 10, the drain electrode terminal 13 and the gate electrode terminal 11 and the source electrode terminal 12 are arranged on different sides to enhance the withstanding voltage. Specifically, the drain electrode terminal 13 is arranged on the Y1 direction side, and the gate electrode terminal 11 and the source electrode terminal 12 are arranged on the Y2 direction side. Therefore, the drain electrode terminal 13 and the gate electrode terminal 11 face each other and the drain electrode terminal 13 and the source electrode terminal 12 face each other as illustrated in FIG. 2 and the like.

The gate electrode terminal 11, the source electrode terminal 12, the drain electrode terminal 13 that is a die pad are formed of Cu (copper), a copper alloy, or the like and may be partially or fully plated with Ni (nickel). The semiconductor chip 20 is formed of a semiconductor material such as Si or SiC. In order to obtain the semiconductor device 10 having a high withstanding voltage, the semiconductor material is preferably formed of SiC or the like having a band gap wider than that of Si. Other than a field effect transistor, such as a MOSFET, the semiconductor chip 20 may be a bipolar transistor, a diode, or the like.

One surface of the semiconductor chip 20, on which a drain electrode pad of the semiconductor chip 20 is formed, is connected by solder or the like to one surface 13a that is a surface of the drain electrode terminal 13. Thereby, the drain electrode pad of the semiconductor chip 20 is electrically connected to the drain electrode terminal 13.

Also, the gate electrode pad 21 provided on the exposed other surface of the semiconductor chip 20 is connected by the bonding wire 31 to a connection portion 11a on the drain electrode terminal 13 side of the gate electrode terminal 11. Also, the source electrode pad 22 is connected by the bonding wire 32 to a connection portion 12a on the drain electrode terminal 13 side of the source electrode terminal 12. Note that in the present application, the semiconductor chip 20 may be described as a semiconductor device and the bonding wires 31 and 32 may be described as wires.

Such a semiconductor chip 20 mounted on the drain electrode terminal 13, the connection portion 11a of the gate electrode terminal 11, and the connection portion 12a of the source electrode terminal 12 are covered by a resin portion 40 formed of a resin material such as a mold resin, as illustrated in FIG. 1 and the like. Accordingly, one surface 13a that is a surface of the drain electrode terminal 13, on which the semiconductor chip 20 is mounted, is covered by the resin portion 40, and the other surface 13b is exposed.

In the semiconductor device 10, as illustrated in FIG. 2, between the source electrode terminal 12 and the drain electrode terminal 13, a distance $L_{Y1}$ in the Y1-Y2 direction is about 0.3 mm and a distance $L_{Z1}$ in the Z1-Z2 direction is about 1.3 mm.

The dielectric withstanding voltage of such a semiconductor device 10 is about 5 kV, and when a voltage higher than this is applied, the semiconductor device is dielectric broken down due to discharge. In such a semiconductor device 10, a discharge in a case where a high voltage is applied is likely to occur, inside the resin portion 40, between the drain electrode terminal 13 and the source electrode terminal 12, and occurs, outside the resin portion 40, through the surface of the resin portion 40 between the source electrode terminal 12 and the drain electrode terminal 13.

A case inside the resin portion 40 will be described in more detail. Inside the resin portion 40, an end portion 13c closest to the source electrode terminal 12 of the drain electrode terminal 13, i.e., the end portion 13c in the Z1 direction and in the Y2 direction of the drain electrode terminal 13 is angled at a substantially right angle. Similarly, an end portion 12c closest to the drain electrode terminal 13 of the source electrode terminal 12, i.e., the end portion 12c in the Z2 direction and in the Y1 direction of the source electrode terminal 12 is angled at a substantially right angle.

The electric field strength is high at a portion whose corner is angled at a substantially right angle, such as at the end portion 13c of the drain electrode terminal 13 and at the end portion 12c of the source electrode terminal 12. Therefore, it is considered that when the potential difference between the drain electrode terminal 13 and the source electrode terminal 12 is large, the electric field is concentrated and a discharge occurs between the end portion 13c of the drain electrode terminal 13 and the end portion 12c of the source electrode terminal 12.

(Semiconductor Device)

Next, a semiconductor device according to the present embodiment will be described with reference to FIG. 4 to FIG. 6. Note that FIG. 4A is an external top view of the semiconductor device according to the present embodiment, FIG. 4B is a bottom view, and FIG. 4C is a side view. FIG. 5 is a cross-sectional view taken along dotted line 4A-4B in FIG. 4A, and FIG. 6 is a top view of this semiconductor device according to the present embodiment in which the mold resin is removed. Note that in FIG. 5 and FIG. 6 are enlarged for convenience.

According to the present embodiment, a semiconductor device 110 includes a gate electrode terminal 111, a source electrode terminal 112, and a plate-shaped drain electrode terminal 113 that is a die. With respect to a semiconductor chip 20, a drain electrode pad side of the semiconductor chip 20 is mounted on the drain electrode terminal 113 and is joined by solder or the like. Thus, the drain electrode pad of the semiconductor chip 20 is electrically connected to the drain electrode terminals 113. Note that the drain electrode terminal 113 may be described as a first electrode terminal, the source electrode terminal 112 may be described as a second electrode terminal, and the gate electrode terminal 111 may be described as a third electrode terminal.

Also, a gate electrode pad 21 of the semiconductor chip 20 is connected to the gate electrode terminal 111 by a bonding wire 31 or the like, and a source electrode pad 22 is connected to the source electrode terminal 12 by a bonding wire 32 or the like. In the semiconductor device 110 according to the present embodiment, the drain electrode terminal 113 and the gate electrode terminal 111 and the source electrode terminal 112 are arranged on different sides to enhance the withstanding voltage. Specifically, the drain electrode terminal 113 is arranged on the Y1 direction side, and the gate electrode terminal 111 and the source electrode terminal 112 are arranged on the Y2 direction side. Accordingly, as illustrated in FIG. 5 and the like, the drain electrode terminal 113 and the gate electrode terminal 111 face each other the drain electrode terminal 113 and the source electrode terminal 112 face each other.

The gate electrode terminal 111, the source electrode terminal 112, and the drain electrode terminal 113, which is a die, are formed of Cu, a copper alloy, or the like and have a surface plated with Ni.

One surface of the semiconductor chip 20, on which a drain electrode pad of the semiconductor chip 20 is formed, is connected by solder or the like to one surface 113a that is a surface of the drain electrode terminal 113. Also, the gate electrode pad 21 provided on the exposed other surface of the semiconductor chip 20 is connected by the bonding wire 31 to a connection portion 111a on the drain electrode terminal 13 side of the gate electrode terminal 111. Also, the source electrode pad 22 is connected by the bonding wire 32 to a connection portion 112a on the drain electrode terminal 13 side of the source electrode terminal 112. Note that the bonding wires 31 and 32 are formed of aluminum or copper.

In the semiconductor device 110 according to the present embodiment, both one surface 113a and the other surface 113b of such a drain electrode terminal 113 are covered by a resin portion 140 formed of a resin material such as a mold resin. Thus, the semiconductor chip 20 mounted on the drain electrode terminal 113, the connection portion 111a of the gate electrode terminal 111, and the connection portion 112a of the source electrode terminal 112 are covered by the resin portion 140 formed of a resin material such as a mold resin.

In the present embodiment, the creepage distance can be increased by partially covering the other surface 113b of the drain electrode terminal 113 with the resin portion 140. That is, the distance via the surface of the resin portion 140 between the source electrode terminal 112 and the other surface 113b of the drain electrode terminal 113 can be increased.

Further, in the semiconductor device 110 according to the present embodiment, on the Y2 direction side that is the direction away from the drain electrode terminal 113, the gate electrode terminal 111 is covered by a resin portion 140a, and the source electrode terminal 112 is covered by a resin portion 140b, as illustrated in FIG. 4 and the like. Thereby, the creepage distance between the drain electrode terminal 113 and the source electrode terminal 112 and the creepage distance between the drain electrode terminal 113 and the gate electrode terminal 111 can be further extended, and the withstanding voltage can be enhanced.

Also, in the semiconductor device 110 according to the present embodiment, as illustrated in FIG. 5, between the source electrode terminal 112 and the drain electrode terminal 113, a distance $L_{Y2}$ in the Y1-Y2 direction is about 1.3 mm and a distance $L_{Z2}$ in the Z1-Z2 direction is about 1.3 mm. In addition, an end portion 113c closest to the source electrode terminal 112 of the drain electrode terminal 113, i.e., the end portion 113c in the Z1 direction and the end portion 113c in the Y2 direction of the drain electrode terminal 113 is chamfered into a C-surface or an R-surface. For example, the end portion 113c is chamfered with a C0.3 mm.

Also, an end portion 112c closest to the drain electrode terminal 113 of the source electrode terminal 112, i.e., the end portion 112c that is the end in the Z2 direction and is the end in the Y1 direction of the source electrode terminal 112 is chamfered into a C-surface or an R-surface. For example, the end portion 112c is chamfered with a C0.2 mm. Note that the gate electrode terminal 111 is also chamfered at an end portion that is the end in the Z2 direction and that is the end in the Y1 direction.

As described above, by chamfering the portions where the source electrode terminal 112 and the drain electrode terminal 113 are closest to each other into a C-surface or a R-surface, the electric field strength at the portions can be kept low and the electric field concentration can be reduced. That is, at the source electrode terminal 112 and the drain electrode terminal 113, by chamfering substantially right angle corners, where the electric field strength increases, into a C-surface or a R-surface, the electric field intensity near the corners can be kept low and the electric field concentration can be reduced.

Thus, results of simulations performed with respect to the electric field strength in a case in which the end portion 112c of the source electrode terminal 112 and the end portion 113c of the drain electrode terminal 113 are chamfered to form a C-surface or a R-surface will be described. In the simulation, it is assumed that, between the source electrode terminal and the drain electrode terminal, the distance is approximately 1.3 mm in the Y1-Y2 direction and the distance is approximately 1.3 mm in the Z1-Z2 direction. Also, it is assumed that a DC voltage of 0 V is applied to the source electrode terminal and a DC voltage of 11 kV is applied to the drain electrode terminal. Also, it is assumed that a resin portion with a dielectric constant of 4.2 covers between the source electrode terminal and the drain electrode terminal, and the end of the drain electrode terminal closest to the source electrode terminal is set to C0.3 mm.

Under these conditions, the maximum electric field strength in the vicinity of the end portion of the source electrode terminal when the shape of the end portion of the source electrode terminal closest to the drain electrode terminal was obtained by simulation. Specifically, simulations were performed for the cases where the shape of the end portion the source electrode terminal was no chamfered (right angle), C0.1 mm, C0.2 mm, R0.1 mm, and R0.2 mm. The results are indicated in Table 1.

Note that "C" means C chamfering, and "R" means R chamfering. Also, C chamfering makes a flat surface by removing a corner to be an end portion, and C0.1 mm indicates a distance from the corner of an end portion before being removed to the end of the removed portion. Further, R chamfering makes a rounded surface by removing a corner to be an end portion, and R0.1 mm indicates that a R-chamfered surface becomes a rounded surface whose radius of curvature is 0.1 mm. In the present application, a portion where C chamfering or R chamfering is performed at a corner of an end portion may be described as a chamfered portion. Further, the method of forming a chamfered portion is not limited to a case of directly removing the corner of an end portion. A chamfered portion may be formed using a mold or the like in which a portion corresponding to the chamfered portion is formed.

TABLE 1

| SHAPE OF END PORTION OF SOURCE ELECTRODE TERMINAL | MAXIMUM ELECTRIC FIELD STRENGTH NEAR END PORTION OF SOURCE ELECTRODE TERMINAL [kV/mm] | ELECTRIC FIELD REDUCTION EFFECT |
| --- | --- | --- |
| RIGHT ANGLE | 11.61 | — |
| C0.1 mm | 10.05 | 13% |
| C0.2 mm | 9.69 | 17% |
| R0.1 mm | 10.55 | 9% |
| R0.2 mm | 9.49 | 18% |

As indicated in Table 1, in the case where the shape of the end portion of the source electrode terminal was not chamfered (was right angle), the maximum electric field strength near the end portion of the source electrode terminal was approximately 11.61 kV/mm. Also, in the case where the shape of the end portion of the source electrode terminal was C0.1 mm, the maximum electric field strength near the end portion of the source electrode terminal was approximately 10.05 kV/mm, and the electric field strength can be reduced by approximately 13% in comparison with the case where the shape of the end portion is right angle. Also, in the case where the shape of the end portion of the source electrode terminal was C0.2 mm, the maximum electric field strength near the end portion of the source electrode terminal was approximately 9.69 kV/mm, and the electric field strength can be reduced by approximately 17% in comparison with the case where the shape of the end portion is right angle.

Also, in the case where the shape of the end portion of the source electrode terminal was R0.1 mm, the maximum electric field strength near the end portion of the source electrode terminal was approximately 10.55 kV/mm, and the electric field strength can be reduced by approximately 9% in comparison with the case where the shape of the end portion is right angle. Also, in the case where the shape of the end portion of the source electrode terminal was R0.2 mm, the maximum electric field strength near the end portion of the source electrode terminal was approximately 9.49 kV/mm, and the electric field strength can be reduced by approximately 18% in comparison with the case where the shape of the end portion is right angle.

Further, according to the present embodiment, as illustrated in FIG. 6, both ends in the X1-X2 direction on the gate electrode terminal 111 side and on the drain electrode terminal 113 side of the source electrode terminal 112 are chamfered into a C-surface or a R-surface. That is, an end portion 113d, which is the end of the drain electrode terminal 113 in the Y2 direction and is the end of the drain electrode terminal 113 in the X1 direction, and an end portion 113e, which is the end of the drain electrode terminal 113 in the X2 direction, are chamfered into a C-surface or a R-surface. For example, the end portions 113d and 113e are chamfered with a C1.5 mm.

Further, both ends in the X1-X2 direction on the drain electrode terminal 113 side of the gate electrode terminal 111 are chamfered to into a C-surface or the R-surface. That is, an end portion 111d, which is the end of the gate electrode terminal 111 in the Y1 direction and is the end of the gate electrode terminal 111 in the X1 direction, and an end portion 11e, which is the end of the gate electrode terminal 111 in the X2 direction, are chamfered into a C-surface or a R-surface. For example, the end portions 111d and 111e are chamfered with a C0.3 mm.

Also, both ends in the X1-X2 direction on the drain electrode terminal 113 side of the source electrode terminal 112 are chamfered into a C-surface or a R-surface. That is, an end portion 112d, which is the end of the source electrode terminal 112 in the Y1 direction and is the end of the source electrode terminal 112 in the X1 direction, and an end portion 112e, which is the end of the source electrode terminal 112 in the X2 direction, are chamfered into a C-surface or a R-surface. For example, the end portions 112d and 112e are chamfered with a C0.3 Mm.

(Experimental Results)

Next, the results of a voltage breakdown test in a case where the semiconductor device 110 according to the present embodiment and the semiconductor device illustrated in FIG. 7 were actually prepared and a voltage was applied between the source and the drain will be described. Note that in the semiconductor device illustrated in FIG. 7, the gate electrode terminal 11, the source electrode terminal 12, and the drain electrode terminal 13 that are not chamfered at their end portions are used, but the resin portion 140 covers a portion of the other surface 13b of the drain electrode terminal 13. Accordingly, the semiconductor device illustrated in FIG. 7 has an internal structure similar to that illustrated in FIG. 3, but has an external shape similar to that of the semiconductor device according to the present embodiment as illustrated in FIG. 4 and the like.

FIG. 8 indicates the result of the breakdown voltage test in a case where a voltage was applied between the source and the drain of the semiconductor device 110 according to the present embodiment illustrated in FIG. 4 to FIG. 6, and FIG. 9 indicates the result of the breakdown voltage test in a case where a voltage was applied between the source and the drain of the semiconductor device of the structure illustrated in FIG. 7. Note that the voltage applied between the source and the drain is an AC voltage of 50 Hz.

As illustrated in FIG. 8 and FIG. 9, in the semiconductor device according to the present embodiment, the AC effective value of the withstanding voltage was 14 kV (peak 19.8 kV). In contrast, in the semiconductor device of the structure illustrated in FIG. 7, the AC effective value of the withstanding voltage was 10 kV (peak 14.1 kV). Thus, the withstanding voltage of the semiconductor device according to the present embodiment is higher than that of the semiconductor device illustrated in FIG. 7 because a C-surface is formed at the end portion 113c of the drain electrode terminal 113 on the source electrode terminal 112 side and at the end portion 112c of the source electrode terminal 112 of the drain electrode terminal 113.

Note that the withstanding voltage of the semiconductor device of the structure illustrated in FIG. 7 is higher than that of the semiconductor device of the structure illustrated in FIG. 1 to FIG. 3. This is because the creepage distance of the drain electrode terminal 13 and the source electrode terminal 12 can be increased by the resin portion 140 also covering the other surface 13b of the drain electrode terminal 13. That is, by also covering the other surface 13b of the drain electrode terminal 13 with the resin portion 140, the creepage distance can be made longer than that of the semiconductor device of the structure illustrated in FIG. 1 to FIG. 3, and the withstanding voltage can be enhanced. In the semiconductor device according to the present embodiment, because the end portion 113c of the drain electrode terminal 113 on the source electrode terminal 112 side and the end portion 112c of the source electrode terminal 112 on the drain electrode terminal 113 side are a C-surface or a R-surface, the withstanding voltage can be further enhanced.

Although a case has been described above in which the semiconductor chip 20 is a MOSFET, the semiconductor chip 20 may be another unipolar transistor. The semiconductor chip 20 may also be a bipolar transistor, an Insulated Gate Bipolar Transistor (IGBT), or the like. In the case of a bipolar transistor, the first electrode terminal corresponding to the drain electrode terminal 113 is a collector electrode terminal, the second electrode terminal corresponding to the source electrode terminal 112 is an emitter electrode terminal, and the third electrode terminal corresponding to the gate electrode terminal 111 is a base electrode terminal. In the case of an IGBT, the first electrode terminal corresponding to the drain electrode terminal 113 is a collector electrode terminal, the second electrode terminal corresponding to the source electrode terminal 112 is an emitter electrode terminal, and the third electrode terminal is the gate electrode terminal 111.

The semiconductor chip 20 may also be a diode or the like. In this case, as illustrated in FIG. 10, the first electrode terminal corresponding to the drain electrode terminal 113 is a cathode electrode terminal 213, and the second electrode terminal corresponding to the source electrode terminal 112 is an anode electrode terminal 212. A cathode electrode formed on one surface of a semiconductor chip 220, which is a diode, is connected by solder or the like on the surface of the cathode electrode terminal 213, which is the first electrode terminal. An anode electrode 221 formed on the other surface of the semiconductor chip 220 is connected to the anode electrode terminal 212, which is the second electrode terminal, by a bonding wire 33. An end portion of a portion, facing the anode electrode terminal 212, of the cathode electrode terminal 213 is chamfered into a C-surface or a R-surface similarly to the drain electrode terminal 113. Also, an end portion of a portion, facing the cathode electrode terminal 213, of the anode electrode terminal 212 is chamfered into a C-surface or a R-surface similarly to the source electrode terminal 112. Note that although it is not illustrated in FIG. 10, a structure may be employed in which the cathode electrode terminal 213 and the third electrode terminal 211 are connected by a bonding wire or the like.

Although the embodiment has been described above in detail, it is not limited to a specific embodiment, and various modifications and changes can be made within the scope described in claims.

DESCRIPTION OF THE REFERENCE NUMERALS 10 semiconductor device
20 semiconductor chip
21 gate electrode pad
22 source electrode pad
31, 32 bonding wire
110 semiconductor device
111 gate electrode terminal
111a connection portion
111c, 111d, and 111e end portion
112 source electrode terminal
112a connection portion
112c, 112d, and 112e end portion
113 drain electrode terminal
113a one surface
113b the other surface
113c, 113d, and 113e end portion
140 resin portion

The invention claimed is:
1. A semiconductor device comprising:
a first electrode terminal of a die pad;
a second electrode terminal of a lead;
a semiconductor element having an electrode on one surface connected to one surface of the first electrode terminal;
a wire that connects an electrode on another surface of the semiconductor element and the second electrode terminal;
a resin portion formed of an insulator covering the semiconductor element, a part of the second electrode terminal, and the one surface of the first electrode terminal,
wherein a height position of the die pad differs from a height position of the lead,
wherein one side of the first electrode terminal and one side of the second electrode terminal face each other, where a spatial distance between the first electrode terminal and the second electrode terminal is shortest, and
wherein the one side of the first electrode terminal is chamfered into a C-surface or a R-surface to increase the spatial distance.
2. A semiconductor device comprising:
a first electrode terminal of a die pad;
a second electrode terminal of a lead;
a semiconductor element having an electrode on one surface connected to one surface of the first electrode terminal;
a wire that connects an electrode on another surface of the semiconductor element and the second electrode terminal;

a resin portion formed of an insulator covering the semiconductor element, a part of the second electrode terminal, and the one surface of the first electrode terminal,
wherein a height position of the die pad differs from a height position of the lead,
wherein one side of the first electrode terminal and one side of the second electrode terminal face each other, where a spatial distance between the first electrode terminal and the second electrode terminal is shortest, and
wherein the one side of the second electrode terminal is chamfered into a C-surface or a R-surface to increase the spatial distance.

3. A semiconductor device comprising:
a first electrode terminal of a die pad;
a second electrode terminal of a lead;
a semiconductor element having an electrode on one surface connected to one surface of the first electrode terminal;
a wire that connects an electrode on another surface of the semiconductor element and the second electrode terminal;
a resin portion formed of an insulator covering the semiconductor element, a part of the second electrode terminal, and the one surface of the first electrode terminal,
wherein a height position of the die pad differs from a height position of the second electrode terminal,
wherein one side of the first electrode terminal and one side of the second electrode terminal face each other, where a spatial distance between the first electrode terminal and the second electrode terminal is shortest, and
wherein the one side of the first electrode terminal is chamfered into a C-surface or a R-surface to increase the spatial distance.

4. A semiconductor device comprising:
a first electrode terminal of a die pad;
a second electrode terminal of a lead;
a semiconductor element having an electrode on one surface connected to one surface of the first electrode terminal;
a wire that connects an electrode on another surface of the semiconductor element and the second electrode terminal;
a resin portion formed of an insulator covering the semiconductor element, a part of the second electrode terminal, and the one surface of the first electrode terminal,
wherein a height position of the die pad differs from a height position of the second electrode terminal,
wherein one side of the first electrode terminal and one side of the second electrode terminal face each other, where a spatial distance between the first electrode terminal and the second electrode terminal is shortest, and
wherein the one side of the second electrode terminal is chamfered into a C-surface or a R-surface to increase the spatial distance.

5. The semiconductor device according to claim 3, wherein the chamfered surface is a C-surface.

6. The semiconductor device according to claim 3, wherein the chamfered surface is a R-surface.

7. The semiconductor device according to claim 3, wherein the chamfered surface is a flat surface.

8. The semiconductor device according to claim 3, wherein the chamfered surface is a rounded surface.

9. The semiconductor device according to claim 3, further comprising:
a third electrode terminal,
wherein the semiconductor element is a unipolar transistor,
wherein the first electrode terminal is a drain electrode terminal, the second electrode terminal is a source electrode terminal, and the third electrode terminal is a gate electrode terminal, and
wherein the third electrode terminal is connected by another wire to another electrode on said another surface of the semiconductor element.

10. The semiconductor device according to claim 3, further comprising:
a third electrode terminal,
wherein the semiconductor element is a bipolar transistor,
wherein the first electrode terminal is a collector electrode terminal, the second electrode terminal is an emitter electrode terminal, and the third electrode terminal is a base electrode terminal, and
wherein the third electrode terminal is connected by another wire to another electrode on said another surface of the semiconductor element.

11. The semiconductor device according to claim 3, further comprising:
a third electrode terminal,
wherein the semiconductor element is an IGBT,
wherein the first electrode terminal is a collector electrode terminal, the second electrode terminal is an emitter electrode terminal, and the third electrode terminal is a gate electrode terminal, and
wherein the third electrode terminal is connected by another wire to another electrode on said another surface of the semiconductor element.

12. The semiconductor device according to claim 3,
wherein the semiconductor element is a diode, and
wherein the first electrode terminal is a cathode electrode terminal and the second electrode terminal is an anode electrode terminal.

13. The semiconductor device according to claim 3, wherein the semiconductor element is formed of SiC.

14. The semiconductor device according to claim 3, wherein a portion of another surface of the first electrode terminal is also covered by the resin portion.

15. The semiconductor device according to claim 3, wherein the one side of the first electrode terminal and the one side of the second electrode terminal, which face each other, are chamfered into a C-surface or a R-surface in top view.

16. The semiconductor device according to claim 4, wherein the chamfered surface is a C-surface.

17. The semiconductor device according to claim 4, wherein the chamfered surface is a R-surface.

18. The semiconductor device according to claim 4, wherein the chamfered surface is a flat surface.

19. The semiconductor device according to claim 4, wherein the chamfered surface is a rounded surface.

20. The semiconductor device according to claim 4, further comprising:
a third electrode terminal,
wherein the semiconductor element is a unipolar transistor,
wherein the first electrode terminal is a drain electrode terminal, the second electrode terminal is a source electrode terminal, and the third electrode terminal is a gate electrode terminal, and wherein the third electrode terminal is connected by another wire to another electrode on said another surface of the semiconductor element.

21. The semiconductor device according to claim 4, further comprising:

a third electrode terminal, wherein the semiconductor element is a bipolar transistor, wherein the first electrode terminal is a collector electrode terminal, the second electrode terminal is an emitter electrode terminal, and the third electrode terminal is a base electrode terminal, and wherein the third electrode terminal is connected by another wire to another electrode on said another surface of the semiconductor element.

22. The semiconductor device according to claim 4, further comprising:

a third electrode terminal, wherein the semiconductor element is an IGBT, wherein the first electrode terminal is a collector electrode terminal, the second electrode terminal is an emitter electrode terminal, and the third electrode terminal is a gate electrode terminal, and wherein the third electrode terminal is connected by another wire to another electrode on said another surface of the semiconductor element.

23. The semiconductor device according to claim 4, wherein the semiconductor element is a diode, and wherein the first electrode terminal is a cathode electrode terminal and the second electrode terminal is an anode electrode terminal.

24. The semiconductor device according to claim 4, wherein the semiconductor element is formed of SiC.

25. The semiconductor device according to claim 4, wherein a portion of another surface of the first electrode terminal is also covered by the resin portion.

26. The semiconductor device according to claim 4, wherein the one side of the first electrode terminal and the one side of the second electrode terminal, which face each other, are chamfered into a C-surface or a R-surface in top view.

* * * * *